(12) United States Patent
Hong et al.

(10) Patent No.: US 11,037,960 B2
(45) Date of Patent: Jun. 15, 2021

(54) THIN FILM TRANSISTOR ARRAY PANEL AND DISPLAY DEVICE

(71) Applicant: WUHAN CHINA STAR OPTOELECTRONICS TECHNOLOGY CO., LTD., Hubei (CN)

(72) Inventors: Guanghui Hong, Hubei (CN); Jingfeng Xue, Hubei (CN); Qiang Gong, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 93 days.

(21) Appl. No.: 16/462,227

(22) PCT Filed: Sep. 17, 2018

(86) PCT No.: PCT/CN2018/105944
§ 371 (c)(1),
(2) Date: May 19, 2019

(87) PCT Pub. No.: WO2020/019444
PCT Pub. Date: Jan. 30, 2020

(65) Prior Publication Data
US 2020/0212070 A1    Jul. 2, 2020

(30) Foreign Application Priority Data
Jul. 25, 2018   (CN) .......................... 201810826911.8

(51) Int. Cl.
*H01L 27/12*   (2006.01)

(52) U.S. Cl.
CPC ....... *H01L 27/124* (2013.01); *G09G 2300/04* (2013.01); *G09G 2300/0404* (2013.01); *G09G 2300/0426* (2013.01); *G09G 2320/0223* (2013.01)

(58) Field of Classification Search
CPC .............. H01L 27/124; H01L 27/1255; G09G 2300/04; G09G 2300/0404; G09G 2300/0426; G09G 2320/0223
USPC ....................................................... 345/204
See application file for complete search history.

(56) References Cited

U.S. PATENT DOCUMENTS

| 2017/0337876 | A1 | 11/2017 | Kim et al. |
| 2019/0081128 | A1 | 3/2019 | Yu et al. |
| 2019/0245029 | A1* | 8/2019 | Ka ...................... H01L 27/3262 |
| 2019/0252411 | A1* | 8/2019 | Lee ..................... H01L 27/1218 |

FOREIGN PATENT DOCUMENTS

| CN | 107908031 A | 4/2018 |
| CN | 108227327 A | 6/2018 |
| CN | 108281089 A | 7/2018 |

* cited by examiner

*Primary Examiner* — Jason M Mandeville
(74) *Attorney, Agent, or Firm* — Mark M. Friedman (57) ABSTRACT

A TFT array panel includes a primary display area and a slitting-edge display area. In the slitting-edge display area, a first metallic routing layer includes a first data line and a second metallic routing layer includes a first gate line. The first data line is connected to the second metallic routing layer through a hole in the interlayer dielectric layer so that the first data line overlaps the first gate line to form an overlapping capacitance to compensate for a gate line RC value.

4 Claims, 4 Drawing Sheets

THIN FILM TRANSISTOR ARRAY PANEL AND DISPLAY DEVICE

CROSS-REFERENCE TO RELATED APPLICATIONS

This application is a U.S. National Phase application submitted under 35 U.S.C. § 371 of Patent Cooperation Treaty Application serial No. PCT/CN2018/105944, filed on Sep. 17, 2018 which claims the priority of China Patent Application serial No. 201810826911.8, filed on Jul. 25, 2018 the disclosures of which are incorporated herein by reference in their entirety.

BACKGROUND

1. Field of the Disclosure

The present disclosure relates to the field of display, and more particularly, to a thin film transistor (TFT) array panel and a display device.

2. Description of the Related Art

With the development of display panels, the use of a full screen has become increasingly popular. In order to achieve the full-screen design of a whole machine and to retain the position of a front sensor and a camera, the top of the display panel needs to be slit to form a profiled panel. That is to say, some pixel units are emptied and the emptied space is for the sensor and the camera.

In the slitting design of the related art, the cross-driving of the panel is usually performed by routing a gate line at the slitting edge. Because some of the pixels are emptied at the slitting edge, the gate line RC value of the gate line winding at the slitting edge is different from the gate line RC value of the normal display area, and the data line RC value at the slitting edge is different from the data line RC value of the normal display area. The differences of the gate line RC value cause a penetrating voltage imposed on each row of the gate line at the slitting edge to be inconsistent with the penetrating voltage imposed on the gate line of the normal display area. Finally, the display screen is split, that is, the color display on the splitting edge is not consistent with the color display on the normal display area.

In addition, the slit is usually designed as round so that the data line RC value changes gradually and that the difference between the data line RC value at the slitting edge and the data line RC value in the normal display area does not affect display.

Therefore, to resolve the above-mentioned problem of the related art, it is necessary to provide a structure in which a gate line RC value compensation is provided at the slitting edge.

SUMMARY

The present disclosure proposes a thin film transistor (TFT) array panel and a display device to resolve the above-mentioned problem of the display panel with a slit of the related art that the gate line RC value of the slitting-edge display area is different from the gate line RC value of the primary display area, resulting in unevenness of color display on the slitting edge and on the normal display area.

According to a first aspect of the present disclosure, a thin film transistor (TFT) array panel comprises a primary display area and a slitting-edge display area disposed on one side of the primary display area. The TFT array panel comprises an active layer, an insulating layer, a first metallic routing layer, an interlayer dielectric layer, and a second metallic routing layer. The insulating layer is disposed on the active layer. The first metallic routing layer is disposed on the insulating layer. The interlayer dielectric layer is disposed on the first metallic routing layer. The second metallic routing layer is disposed on the interlayer dielectric layer. In the slitting-edge display area, the first metallic routing layer comprises a first data line, and the second metallic routing layer comprises a first gate line. The first data line comprises an upper data line and a lower data line. The upper data line is arranged near a direct current (DC) signal line. The lower data line overlaps an extending direction of the upper data line. The upper data line is spaced apart from the lower data line. The second metallic routing layer comprises a second data line in the primary display area. The second metallic routing layer further comprises the DC signal line. The DC signal line is in parallel with the first gate line, and the upper data line is connected to the DC signal line through a hole in the interlayer dielectric layer. The lower data line is connected to the corresponding second data line through the hole in the interlayer dielectric layer. The DC signal line is one of a high DC voltage supply line, a low DC voltage supply line, or a common voltage supply line. The active layer comprises a second gate line arranged in a matrix. An extending direction of an orthographic projection of the first gate line on the active layer coincides with an extending direction of an orthographic projection of the second gate line on the active layer. The second gate line is connected to the corresponding first gate line through the hole in the interlayer dielectric layer so that the first gate line and the second gate line form overlapping capacitances with the upper data line of the first data line, respectively, to compensate for a gate line RC value and that the first gate line and the second gate line form overlapping capacitances with the lower data line of the first data line, respectively, to compensate for the gate line RC value and a data line RC value. Each of the second gate lines overlaps three of the first data lines.

According to a second aspect of the present disclosure, a thin film transistor (TFT) array panel comprises a primary display area and a slitting-edge display area disposed on one side of the primary display area. The TFT array panel comprises an active layer, an insulating layer, a first metallic routing layer, an interlayer dielectric layer, and a second metallic routing layer. The insulating layer is disposed on the active layer. The first metallic routing layer is disposed on the insulating layer. The interlayer dielectric layer is disposed on the first metallic routing layer. The second metallic routing layer is disposed on the interlayer dielectric layer. In the slitting-edge display area, the first metallic routing layer comprises a first data line and the second metallic routing layer comprises a first gate line. The first data line is connected to the second metallic routing layer through a hole in the interlayer dielectric layer so that the first data line overlaps the first gate line to form an overlapping capacitance to compensate for a gate line RC value.

Optionally, the second metallic routing layer comprises a second data line in the primary display area. The first data line is connected to the corresponding second data line through the hole in the interlayer dielectric layer so that the first data line and the first gate line form the overlapping capacitance to compensate for the gate line RC value and a data line RC value.

Optionally, in the slitting-edge display area, the second metallic routing layer further comprises a direct current (DC) signal line. The DC signal line is in parallel with the first gate line. The first data line is connected to the DC signal line through the hole in the interlayer dielectric layer so that the first data line and the first gate line form the overlapping capacitance to compensate for the gate line RC value.

Optionally, the DC signal line is one of a high DC voltage supply line, a low DC voltage supply line, or a common voltage supply line.

Optionally, the first data line comprises an upper data line and a lower data line. The upper data line is arranged near a direct current (DC) signal line. The lower data line overlaps an extending direction of the upper data line. The upper data line is spaced apart from the lower data line. The second metallic routing layer comprises a second data line in the primary display area. The second metallic routing layer further comprises the DC signal line. The DC signal line is in parallel with the first gate line. The upper data line is connected to the DC signal line through the hole in the interlayer dielectric layer so that the upper data line and the first gate line form an overlapping capacitance to compensate for the gate line RC value. The lower data line is connected to the corresponding second data line through the hole in the interlayer dielectric layer so that the lower data line and the first gate line form an overlapping capacitance to compensate for the gate line RC value and a data line RC value.

Optionally, the DC signal line is one of a high DC voltage supply line, a low DC voltage supply line, or a common voltage supply line.

Optionally, the active layer comprises a second gate line arranged in a matrix in the slitting-edge display area. An extending direction of an orthographic projection of the first gate line on the active layer coincides with an extending direction of an orthographic projection of the second gate line on the active layer in the slitting-edge display area. The second gate line is connected to the corresponding first gate line through the hole in the interlayer dielectric layer so that the first gate line and the second gate line form an overlapping capacitance with the first data line, respectively, to compensate for the gate line RC value.

Optionally, each of the second gate lines overlaps three of the first data lines.

Optionally, the active layer comprises a second gate line arranged in a matrix in the slitting-edge display area. An extending direction of an orthographic projection of the first gate line on the active layer coincides with an extending direction of an orthographic projection of the second gate line on the active layer in the slitting-edge display area. The second gate line is connected to the corresponding first gate line through the hole in the interlayer dielectric layer so that the first gate line and the second gate line form an overlapping capacitance with the first data line, respectively, to compensate for the gate line RC value.

Optionally, the DC signal line is one of a high DC voltage supply line, a low DC voltage supply line, or a common voltage supply line.

Optionally, each of the second gate lines overlaps three of the first data lines.

Optionally, the active layer comprises a second gate line arranged in a matrix in the slitting-edge display area. An extending direction of an orthographic projection of the first gate line on the active layer coincides with an extending direction of an orthographic projection of the second gate line on the active layer in the slitting-edge display area. The second gate line is connected to the corresponding first gate line through the hole in the interlayer dielectric layer so that the first gate line and the second gate line form overlapping capacitances with the upper data line of the first data line, respectively, to compensate for the gate line RC value and that the first gate line and the second gate line form overlapping capacitances with the lower data line of the first data line, respectively, to compensate for the gate line RC value and a data line RC value.

Optionally, the DC signal line is one of a high DC voltage supply line, a low DC voltage supply line, or a common voltage supply line.

Optionally, each of the second gate lines overlaps three of the first data lines.

According to a third aspect of the present disclosure, a display device comprises the thin film transistor array panel as provided above.

Compared with the related art, the present disclosure proposes a thin film transistor (TFT) array panel where a first metallic routing layer and a second metallic routing layer are arranged in a slitting-edge display area. The first metallic routing layer includes a first data line. The second metallic routing layer includes a first gate line. The first data line is connected to the second metallic routing layer through a hole in an interlayer dielectric layer. In this way, the first data line and the first gate line forms an overlapping capacitance to compensate for a gate line RC value, which makes the gate line RC value of the slitting-edge display area consistent with the gate line RC value of a primary display area. The problem of the related art that the gate line RC value of the slitting-edge display area is different from the gate line RC value of the primary display area, resulting in unevenness of color display on the slitting edge and on the normal display area, is successfully resolved. The present disclosure also proposes a display device with the above-mentioned TFT array panel.

BRIEF DESCRIPTION OF THE DRAWINGS

The accompanying drawings described herein are used to provide further comprehension of the present disclosure, and is a part of the present application. Schematic embodiments of the present invention and the description thereof are used to illustrate the present disclosure, but do not constitute any improper limit to the present disclosure. In the accompanying drawings.

DETAILED DESCRIPTION OF THE EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

Figure 1:
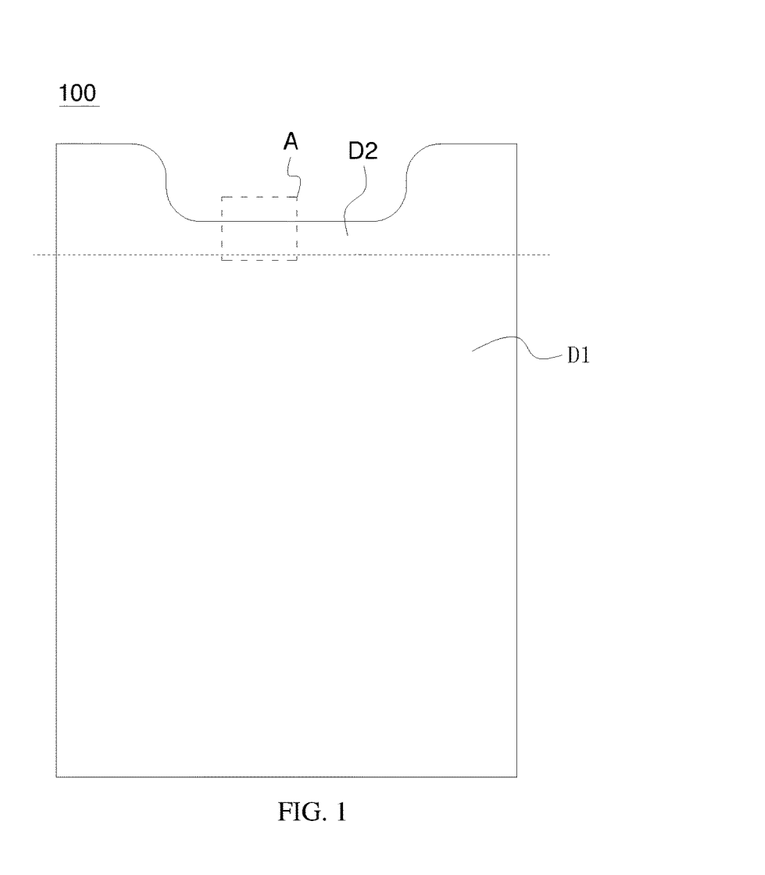
FIG. 1 illustrates a top view of the structure of a thin film transistor (TFT) array panel according to a first embodiment of the present disclosure.
Figure 2:
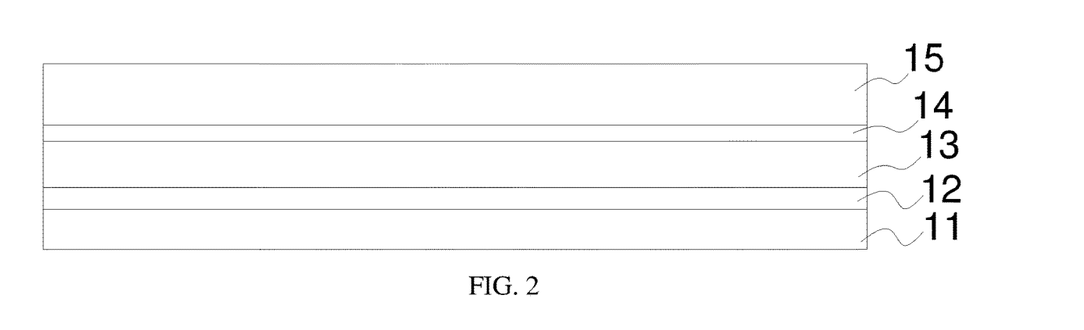
FIG. 2 illustrates a cross-sectional diagram of the TFT array panel according to the first embodiment of the present disclosure.
Figure 3:
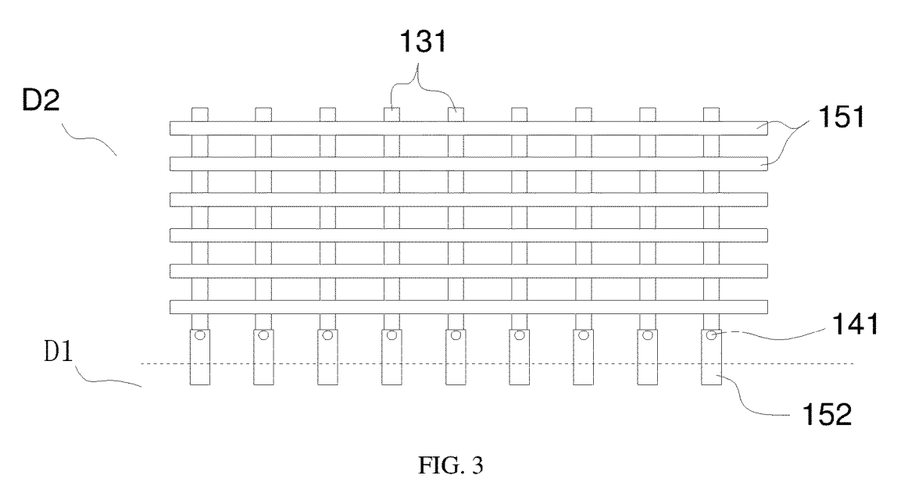
FIG. 3 illustrates a schematic diagram of a slitting-edge display area of the TFT array panel according to the first embodiment of the present disclosure.

Please refer to FIG. 1 to FIG. 3. FIG. 1 illustrates a top view of the structure of a thin film transistor (TFT) array panel 100 according to a first embodiment of the present disclosure. FIG. 2 illustrates a cross-sectional diagram of the TFT array panel 100 according to the first embodiment of the present disclosure. FIG. 3 illustrates an enlargement diagram of A shown in FIG. 1, that is, a schematic diagram of a slitting-edge display area of the TFT array panel 100 proposed by the first embodiment of the present disclosure.

The TFT array panel 100 proposed by the first embodiment includes a primary display area D1 and a slitting-edge display area D2. The slitting-edge display area D2 is disposed on one side of the primary display area D1. The TFT array panel 100 includes an active layer 11, an insulating layer 12, a first metallic routing layer 13, an interlayer dielectric layer 14, and a second metallic routing layer 15. The insulating layer 12 is disposed on the active layer 11. The first metallic routing layer 13 is disposed on the insulating layer 12. The interlayer dielectric layer 14 is disposed on the first metallic routing layer 13. The second metallic routing layer 15 is disposed on the interlayer dielectric layer 14.

In the slitting-edge display area D2, the first metallic routing layer 13 includes a first data line 131. The second metallic routing layer 15 includes a first gate line 151. The first data line 131 is connected to the second metallic routing layer 15 through a hole 141 in the interlayer dielectric layer 14 so that the first data line 131 and the first gate line 151 form an overlapping capacitance to compensate for a gate line RC value.

In the primary display area D1, the second metallic routing layer 15 includes a second data line 152. The first data line 131 is connected to the corresponding second data line 152 through the hole 141 in the interlayer dielectric layer 14.

In the first embodiment, the first metallic routing layer 13 in the slitting-edge display area D2 includes the first data line 131, and the second metallic routing layer 15 includes the first gate line 151. Besides, the first data line 131 is connected to the second data line 152 in the second metallic routing layer 15 through the hole 141 in the interlayer dielectric layer 14 so that the first data line 131 and the first gate line 151 form the overlapping capacitance to compensate for the gate line RC value and a data line RC value. Meanwhile, the first gate line 151 is arranged on the second metallic routing layer 15, which satisfies the demand for the re-etch processing that a gap is arranged between the gate lines in the first metallic layer 13, compensates for the difference between the gate line RC value of the slitting-edge display area and the gate line RC value of the primary display area, and reduces the risk of display unevenness.

In the first embodiment, the first data line 131 and the first gate line 151 form the overlapping capacitance, preferably compensating for the gate line RC value. In this way, the data line RC value can be compensated for if necessary.

In the first embodiment, the extending direction of the first data line 131 is consistent with the extending direction of the second data line 152, which promotes connection and consistency between the first data line 131 and the second data line 152.

Figure 4:
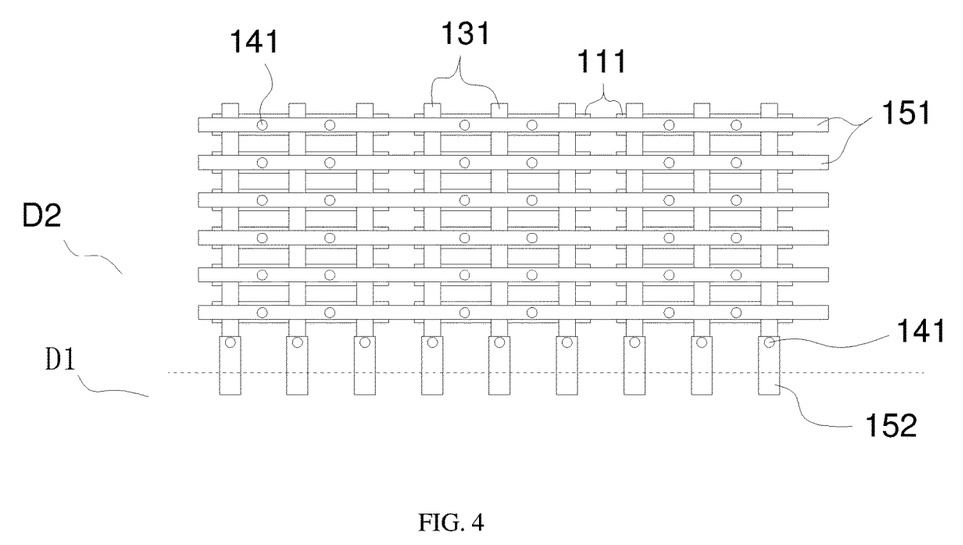
FIG. 4 illustrates a schematic diagram of a slitting-edge display area of the TFT array panel according to the second embodiment of the present disclosure.

Please refer to FIG. 4. A thin film transistor (TFT) array panel proposed by a second embodiment is slightly different from the TFT array panel proposed by the first embodiment. The difference is that: Based on the structure of the TFT array panel proposed by the first embodiment, an active layer includes a second gate line 111 arranged in a matrix in a slitting-edge display area D2. Besides, the extending direction of an orthographic projection of a first gate line 151 on the active layer coincides with the extending direction of an orthographic projection of a second gate line 111 on the active layer in the slitting-edge display area D2.

The second gate line 111 is connected to the corresponding first gate line 151 through a hole 141 in the interlayer dielectric layer 14 so that the first gate line 151 and the second gate line 111 form overlapping capacitances with the first data line 131, respectively, to compensate for the gate line RC value.

Such an arrangement satisfies the demand for the re-etch processing that a gap is arranged between the gate lines in the first metallic layer. In addition, owing to the overlapping capacitance formed by the second gate line and the first data line, the problem that the capacitance compensating value is smaller is resolved. Further, the difference between the gate line RC value of the slitting-edge display area and the gate line RC value of the primary display area is improved, reducing the risk of display unevenness.

In addition, the active layer 11 includes the second gate lines 111 arranged in a matrix. The second gate lines 111 in each row are spaced apart from each other, avoiding the condition that the second gate lines 111 in each row are connected together, thereby improving the stability of the present embodiment.

An entire gate line is formed after the second gate line in each row is connected to one another. The resistance existing in the gate line of the active layer strengthens after long-running operations, which causes the entire second gate line to heat easily. The stability of the entire second gate line is affected accordingly. Therefore, the second gate lines 111 are spaced apart to improve the stability in this embodiment.

In another embodiment, each second gate line 111 and three first data lines 131 are overlapped.

The second gate line 111 may be formed by connecting a plurality of segmented second gate lines in each row as well. The second gate line 111 may be formed by overlapping a second gate line with two first data lines or with a first data line at the same time.

Figure 5:
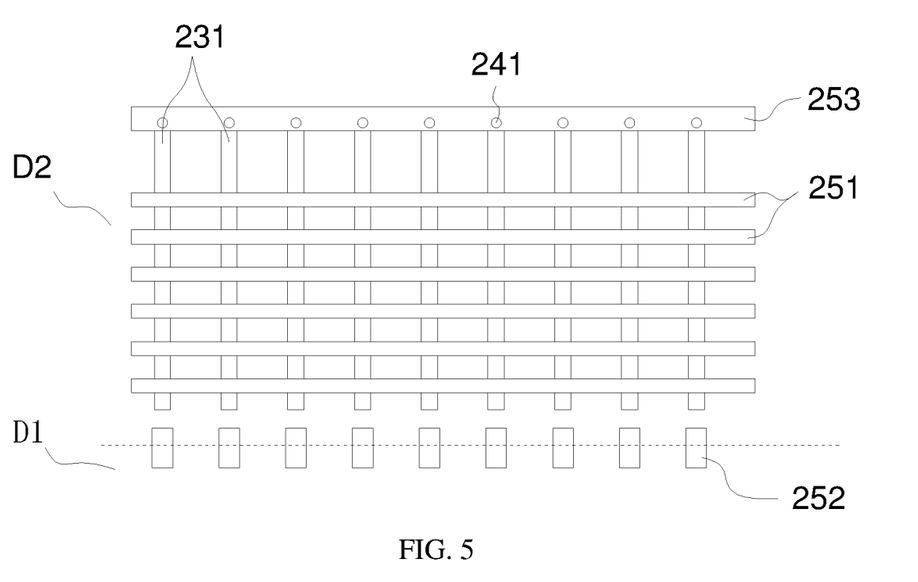
FIG. 5 illustrates a schematic diagram of a slitting-edge display area of the TFT array panel according to the third embodiment of the present disclosure.

Please refer to FIG. 5. In a thin film transistor (TFT) array panel proposed by a third embodiment, a primary display area D1 includes a second data line 252. The second data line 252 is arranged in a second metallic routing layer. The TFT array panel proposed by the third embodiment is slightly different from the TFT array panel proposed by the first embodiment. The difference is that: The second metallic routing layer further includes a direct current (DC) signal line 253 in the slitting-edge display area D2. The DC signal line 253 is in parallel with a first gate line 251. The first data line 231 is connected to the DC signal line 253 through a hole 241 in an interlayer dielectric layer.

The DC signal line 253 is one of a high DC voltage supply line, a low DC voltage supply line, or a common voltage supply line.

In the third embodiment, the slitting-edge display area is usually designed as round so the data line RC value changes gradually. The difference between the data line RC value at the slitting-edge display area and the data line RC value in the primary display area does not affect display, either. Therefore, the first gate line in the second routing layer serves as the gate line of the slitting-edge display area, and the first gate line is connected to the DC signal line at the edge through the hole in the interlayer dielectric layer so that the first gate line and the first data line form an overlapping capacitance to compensate for the gate line RC value. Such an arrangement satisfies the demand for the re-etch processing that a gap is arranged between the gate lines in the first metallic layer. Moreover, the difference between the gate line RC value of the slitting-edge display area and the gate line RC value of the primary display area is compensated for, reducing the risk of display unevenness.

Figure 6:
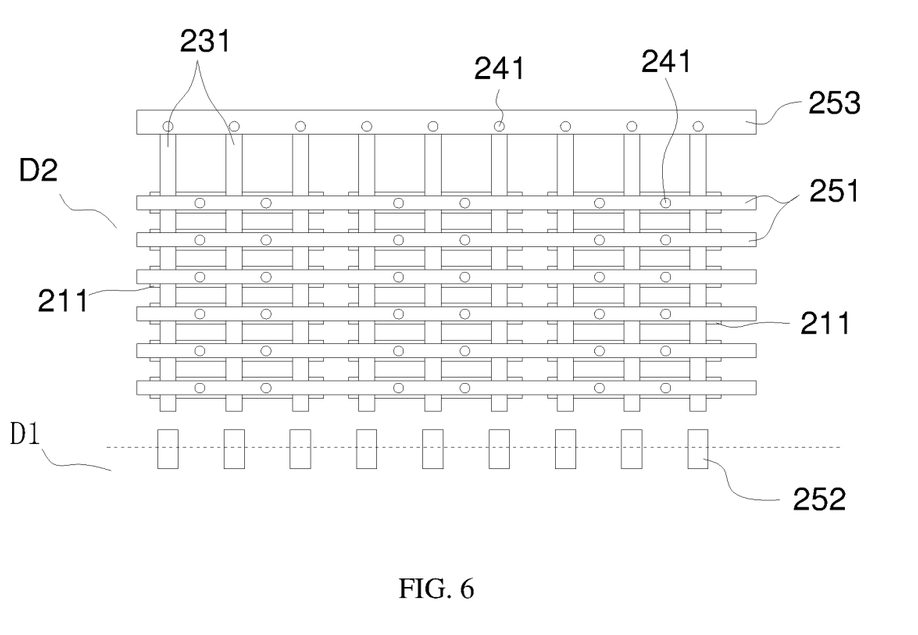
FIG. 6 illustrates a schematic diagram of a slitting-edge display area of the TFT array panel according to the fourth embodiment of the present disclosure.

Please refer to FIG. 6. A thin film transistor (TFT) array panel proposed by a fourth embodiment is slightly different from the TFT array panel proposed by the third embodiment. The difference is that: Based on the structure of the TFT array panel proposed by the third embodiment, an active layer includes a second gate line 211 arranged in a matrix in a slitting-edge display area D2. Besides, the extending direction of an orthographic projection of a first gate line 251 on the active layer coincides with the extending direction of an orthographic projection of a second gate line 211 on the active layer in the slitting-edge display area D2.

The second gate line 211 is connected to the corresponding first gate line 251 through a hole 241 in an interlayer dielectric layer so that the first gate line 251 and the second gate line 211 form overlapping capacitances with the first data line 231, respectively, to compensate for a gate line RC value.

Such an arrangement satisfies the demand for the re-etch processing that a gap is arranged between the gate lines in the first metallic layer. In addition, owing to the overlapping capacitance formed by the second gate line and the first data line, the problem that the capacitance compensating value is smaller is resolved. Further, the difference between the gate line RC value of the slitting-edge display area and the gate line RC value of the primary display area is improved, reducing the risk of display unevenness.

Figure 7:
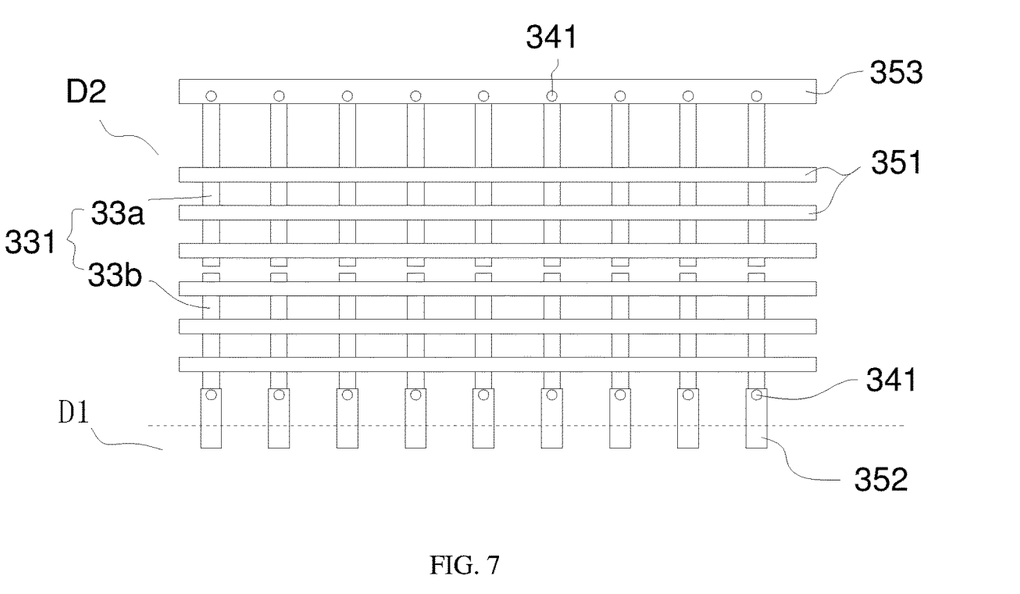
FIG. 7 illustrates a schematic diagram of a slitting-edge display area of the TFT array panel according to the fifth embodiment of the present disclosure.

Please refer to FIG. 7. A thin film transistor (TFT) array panel proposed by a fifth embodiment is slightly different from the TFT array panel proposed by the first embodiment. The difference is that: A first data line 331 includes an upper data line 33a and a lower data line 33b. The upper data line 33a is arranged near a direct current (DC) signal line 353. The lower data line 33b overlaps the extending direction of the upper data line 33a. The upper data line 33a and the lower data line 33b are spaced apart from each other. The second metallic routing layer includes a second data line 352 in a primary display area D1.

The second metallic routing layer further includes a direct current (DC) signal line 353. The DC signal line 353 is in parallel with a first gate line 351. An upper data line 33a is connected to the DC signal line 353 through a hole 341 in an interlayer dielectric layer so that the upper data line 33a and the first gate line 351 form an overlapping capacitance to compensate for a gate line RC value.

A lower data line 33b is connected to a corresponding second data line 352 through the hole 341 in the interlayer dielectric layer so that the lower data line 33b and the first gate line 351 form the overlapping capacitance to compensate for the gate line RC value and a data line RC value.

The upper data line 33a is connected to the DC signal line 353 through the hole 341 in the interlayer dielectric layer. The lower data line 33b is connected to the second data line 352 through the hole 341 in the interlayer dielectric layer. So the upper data line 33a and the lower data line 33b form the overlapping capacitances with the first gate line 351, respectively, to compensate for the gate line RC value and the data line RC value, respectively. Meanwhile, such an arrangement satisfies the demand for the re-etch processing that a gap is arranged between the gate lines in the first metallic layer.

Figure 8:
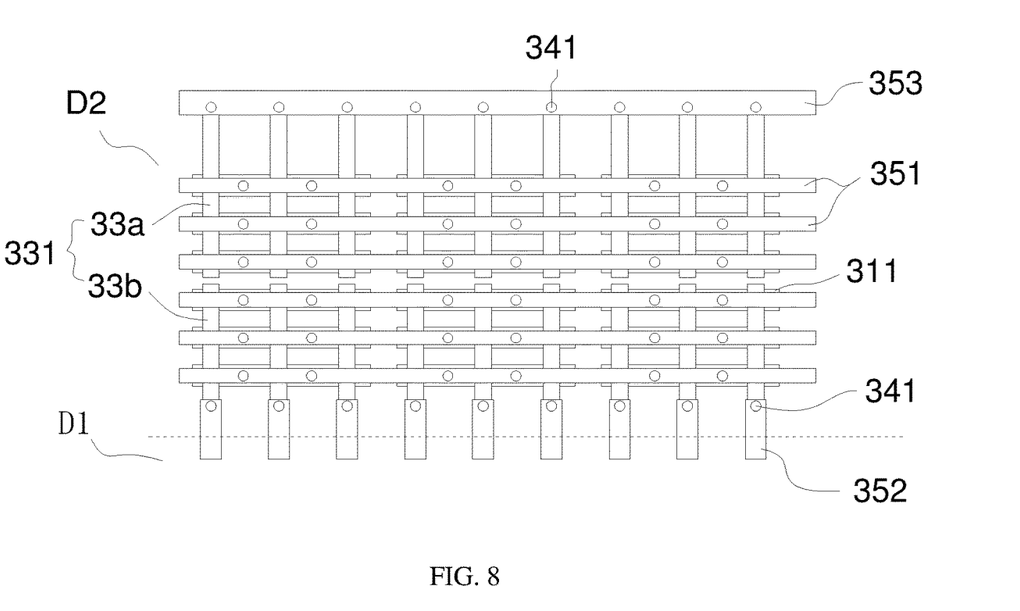
FIG. 8 illustrates a schematic diagram of a slitting-edge display area of the TFT array panel according to the sixth embodiment of the present disclosure.

Please refer to FIG. 8. A thin film transistor (TFT) array panel proposed by a sixth embodiment is slightly different from the TFT array panel proposed by the fifth embodiment. The difference is that: Based on the structure of the TFT array panel proposed by the fifth embodiment, an active layer includes a second gate line 311 arranged in a matrix in a slitting-edge display area D2. Besides, the extending direction of an orthographic projection of a first gate line 351 on the active layer coincides with the extending direction of an orthographic projection of a second gate line 311 on the active layer in the slitting-edge display area D2.

The second gate line 311 is connected to the corresponding first gate line 351 through a hole 341 in an interlayer dielectric layer so that a first gate line 351 and a second gate line 311 form overlapping capacitances with a upper data line 33a disposed on the first data line 331, respectively, to compensate for a gate line RC value and that the first gate line 351 and the second gate line 311 form the overlapping capacitances with the lower data line 33b of the first data line 331, respectively, to compensate for the gate line RC value and a data line RC value.

Such an arrangement satisfies the demand for the re-etch processing that a gap is arranged between the gate lines in the first metallic layer in the sixth embodiment. In addition, owing to the overlapping capacitance formed by the second gate line and the first data line, the problem that the capacitance compensating value is smaller is resolved. Further, the difference between the gate line RC value of the slitting-edge display area and the gate line RC value of the primary display area is improved, reducing the risk of display unevenness. Meanwhile, the upper data line is connected to the DC signal line through the hole in the interlayer dielectric layer. The lower data line is connected to the second data line through the hole in the interlayer dielectric layer. So the overlapping capacitance between the upper data line and the first gate line, and the overlapping capacitance between the lower data line and the first gate line, are used for compensating the gate line RC value and the data line RC value, respectively.

The present disclosure also proposes a display device comprising the thin film transistor array panel as provided above.

Compared with the related art, the present disclosure proposes a thin film transistor (TFT) array panel and a display device having the TFT array panel. A first metallic routing layer and a second metallic routing layer are arranged in a slitting-edge display area of the TFT array panel. The first metallic routing layer includes a first data line. The second metallic routing layer includes a first gate line. The first data line is connected to the second metallic routing layer through a hole in an interlayer dielectric layer.

In this way, the first data line and the first gate line forms an overlapping capacitance to compensate for a gate line RC value, which makes the gate line RC value of the slitting-edge display area consistent with the gate line RC value of a primary display area. The problem of the related art that the gate line RC value of the slitting-edge display area is different from the gate line RC value of the primary display area, resulting in unevenness of color display on the slitting edge and on the normal display area, is successfully resolved.

It should be noted that, the terms such as "first" and "second" in the specification, the claims, and the foregoing accompanying drawings of the present invention are used to distinguish similar objects, and are not necessarily used to describe a specific sequence or specific precedence order. It should be understood that, data used in this manner may be interchanged in a proper circumstance, so that the embodiments of the present invention described herein can be implemented in other sequences than the sequence shown in the drawings or described herein.

In addition, the terms "include", "have", any variants thereof are intended to cover a non-exclusive inclusion, for example, a process, method, system, product, or device that includes a series of steps or units is not necessarily limited to the steps or units specified expressly, but may include other steps or units which are not specified expressly or may include inherent steps or units of the process, method, product or device. The above descriptions are merely exemplary embodiments of the present invention. It should be noted that, any improvement and modifications made by a person of ordinary skill in the part without departing the principle of the present disclosure shall fall within the protection scope of the present disclosure.

What is claimed is:

1. A thin film transistor (TFT) array panel, comprising: a primary display area and a slitting-edge display area disposed on one side of the primary display area, wherein the TFT array panel comprises an active layer, an insulating layer, a first metallic routing layer, an interlayer dielectric layer, and a second metallic routing layer; the insulating layer is disposed on the active layer; the first metallic routing layer is disposed on the insulating layer; the interlayer dielectric layer is disposed on the first metallic routing layer; the second metallic routing layer is disposed on the interlayer dielectric layer, wherein in the slitting-edge display area, the first metallic routing layer comprises a first data line arranged in a matrix, and the second metallic routing layer comprises a first gate line arranged in a matrix;

wherein each first data line comprises an upper data line and a lower data line; the upper data line is arranged near a direct current (DC) signal line; the lower data line overlaps an extending direction of the upper data line; the upper data line is spaced apart from the lower data line; the second metallic routing layer comprises a second data line arranged in a matrix in the primary display area;

wherein the second metallic routing layer further comprises the DC signal line; the DC signal line is in parallel with each first gate line, and each upper data line is connected to the DC signal line through a respective hole in the interlayer dielectric layer;

wherein each lower data line is connected to a corresponding second data line through a respective hole in the interlayer dielectric layer;

wherein the DC signal line is one of a high DC voltage supply line, a low DC voltage supply line, or a common voltage supply line;

wherein the active layer comprises a second gate line arranged in a matrix; an extending direction of an orthographic projection of each first gate line on the active layer coincides with an extending direction of an orthographic projection of each second gate line on the active layer;

wherein each second gate line is connected to a corresponding first gate line through respective holes in the interlayer dielectric layer so that the first gate lines and the second gate lines form overlapping capacitances with each upper data line of the first data lines, respectively, to compensate for a gate line RC value and that the first gate lines and the second gate lines form overlapping capacitances with each lower data line of the first data lines, respectively, to compensate for the gate line RC value and a data line RC value;

wherein each of the second gate lines overlaps three of the first data lines.

2. A display device comprising the thin film transistor array panel as claimed in claim 1.

3. A thin film transistor (TFT) array panel, comprising: a primary display area and a slitting-edge display area disposed on one side of the primary display area, wherein the TFT array panel comprises an active layer, an insulating layer, a first metallic routing layer, an interlayer dielectric layer, and a second metallic routing layer; the insulating layer is disposed on the active layer; the first metallic routing layer is disposed on the insulating layer; the interlayer dielectric layer is disposed on the first metallic routing layer; the second metallic routing layer is disposed on the interlayer dielectric layer;

wherein in the slitting-edge display area, the first metallic routing layer comprises a first data line arranged in a matrix and the second metallic routing layer comprises a first gate line arranged in a matrix;

wherein each first data line comprises an upper data line and a lower data line; the upper data line is arranged near a direct current (DC) signal line; the lower data line overlaps an extending direction of the upper data line; the upper data line is spaced apart from the lower data line; the second metallic routing layer comprises a second data line arranged in a matrix in the primary display area;

wherein the second metallic routing layer further comprises the DC signal line; the DC signal line is in parallel with each first gate line; each upper data line is connected to the DC signal line through a respective hole in the interlayer dielectric layer so that each upper data line and each corresponding first gate line form an overlapping capacitance to compensate for a gate line RC value;

wherein each lower data line is connected to a corresponding second data line through a respective hole in the interlayer dielectric layer so that each lower data line and each corresponding first gate line form an overlapping capacitance to compensate for the gate line RC value and a data line RC value;

wherein the DC signal line is one of a high DC voltage supply line, a low DC voltage supply line, and a common voltage supply line.

4. The TFT array panel of claim 3, wherein the active layer comprises a second gate line arranged in a matrix in the slitting-edge display area; an extending direction of an orthographic projection of each first gate line on the active layer coincides with an extending direction of an orthographic projection of each second gate line on the active layer in the slitting-edge display area;

each second gate line is connected to a corresponding first gate line through respective holes in the interlayer dielectric layer so that the first gate lines and the second gate lines form overlapping capacitances with each upper data line of the first data lines, respectively, to compensate for the gate line RC value and that the first gate lines and the second gate lines form overlapping capacitances with each lower data line of the first data lines, respectively, to compensate for the gate line RC value and the data line RC value.

\* \* \* \* \*